(12) United States Patent
Wehr

(10) Patent No.: US 7,533,455 B2
(45) Date of Patent: May 19, 2009

(54) METHOD OF MAKING RFID DEVICES

(75) Inventor: Mary Ann Wehr, Hamilton, OH (US)

(73) Assignee: The Kennedy Group, Inc., Willoughby, OH (US)

( * ) Notice: Subject to any disclaimer, the term of this patent is extended or adjusted under 35 U.S.C. 154(b) by 48 days.

(21) Appl. No.: 11/452,031

(22) Filed: Jun. 13, 2006

(65) Prior Publication Data

US 2007/0283556 A1    Dec. 13, 2007

(51) Int. Cl.
*H01P 11/00* (2006.01)
(52) U.S. Cl. .................... 29/600; 29/601; 343/700 MS; 340/572.1
(58) Field of Classification Search ............ 29/600, 29/601, 829, 825, 834, 593; 340/572.1, 572.3, 340/572.2–572.8, 568.1; 343/700 MS, 867–868; 156/64, 267–269; 83/37, 495, 510
See application file for complete search history.

(56) References Cited

U.S. PATENT DOCUMENTS

| | | | | |
|---|---|---|---|---|
| 4,369,557 A | * | 1/1983 | Vandebult | .................. 29/25.42 |
| 4,658,264 A | * | 4/1987 | Baker | ......................... 343/895 |
| 6,358,343 B1 | * | 3/2002 | Scott | ............................ 156/69 |
| 6,407,669 B1 | * | 6/2002 | Brown et al. | ............. 340/572.1 |
| 6,451,154 B1 | * | 9/2002 | Grabau et al. | ............... 156/300 |
| 6,618,939 B2 | * | 9/2003 | Uchibori et al. | ............... 29/846 |
| 7,138,919 B2 | * | 11/2006 | Clare et al. | ............. 340/572.1 |
| 7,141,451 B2 | * | 11/2006 | Tsunoda et al. | ............. 438/113 |
| 7,172,670 B2 | * | 2/2007 | Franko, Sr. | ................. 156/256 |
| 2005/0085010 A1 | * | 4/2005 | Tsunoda et al. | ............. 438/106 |
| 2007/0283556 A1 | * | 12/2007 | Wehr | ........................... 29/600 |

* cited by examiner

*Primary Examiner*—Minh Trinh

(57) ABSTRACT

The present invention is directed towards manufacturing a plurality of individual radio frequency devices from a web. The method comprises: transporting the web over a processing area; applying adhesive to the web as it is transported over the processing area; repeatedly applying sets of an antenna and a microchip to the web at spatially separated positions, as the web is transported over the processing area; longitudinally folding the web in half, thereby layering the sets of an antenna and a microchip between the two halves of the web and at least partly holding the sets of an antenna and a microchip in place by the adhesive, as the web is transported over the processing area; and cutting the folded web into individual radio frequency devices, as the web is transported over the processing area.

1 Claim, 5 Drawing Sheets

METHOD OF MAKING RFID DEVICES

BACKGROUND OF THE INVENTION

The present invention relates generally to wireless communication devices, such as radio frequency devices, and the manufacture thereof.

Radio frequency devices, such as radio frequency identification ("RFID") labels are well known in the art and are used in a variety of diverse industries. Typically, RFID labels are placed on or in an object to facilitate wireless identification of that object.

A typical RFID label consists of an RFID inlay positioned between a facestock and a liner of a two-ply label. Normally, the inlay will be strongly adhered to the facestock and releasably adhered to the liner. This enables the facestock and inlay to be peeled from the release liner as a single unit so that the facestock-inlay unit can be adhered to an object.

The fabrication of RFID labels typically starts with pre-manufactured two-ply label web stock. The web stock includes a facestock web and a liner web releasably adhered together by pressure-sensitive adhesive. If the finished RFID labels are to have any text or graphics, the web stock is first printed with the desired indicia. After printing, the web stock is transferred to a separate processing area where it is de-laminated to allow inlays to be inserted.

Once the inlays are inserted between the facestock web and the liner web, adhesive is applied to each of the inlays and the two-ply label web stock is re-laminated with the inlay embedded between the facestock web and a liner web. The web stock is then die-cut to segment the web stock into individual label portions, which can be separated by breaking or tearing to form individual labels.

One of the main inhibitors to further expanding the use of RFID labels is the cost of manufacturing such labels.

SUMMARY

It is among the objects of one or more embodiments of the present invention to produce a radio frequency device in one continuous process.

According to a first aspect of the present invention there is provided a method of manufacturing a plurality of individual radio frequency devices from a web of material having a first side and a second side opposite the first side, and having opposing side edges extending along the web of material and defining a longitudinal dimension and having a front edge transverse to the side edges. The method comprises: (1) transporting the web of material over a processing area; (2) applying adhesive to the first side as the web is transported over the processing area; (3) repeatedly applying sets of an antenna and a microchip to the first side of the web of material at spatially separated positions, as the web is transported over the processing area; (4) folding the web of material in the longitudinal dimension to bring the opposing side edges into proximity or contact, thereby layering the sets of an antenna and a microchip between the web of material and at least partly holding the sets of an antenna and a microchip in place by the adhesive, as the web is transported over the processing area; and (5) cutting the folded web of material into individual radio frequency devices, as the web is transported over the processing area.

In one embodiment, the step of repeatedly applying sets of an antenna and a microchip, may further comprises, for each set of an antenna and a microchip, printing the antenna with electric conductive ink and connecting the microchip to the printed antenna. In another embodiment, the step of repeatedly applying sets of an antenna and a microchip, further comprises, for each set of an antenna and a microchip, applying a prefabricated inlay which includes an antenna connected to a microchip. In still another embodiment, the step of repeatedly applying sets of an antenna and a microchip further comprises: forming an antenna with conductive adhesive at each of the spatially separated positions; and connecting a microchip to the conductive adhesive at each of the spatially separated positions.

The method may further comprise the step of printing indicia on the second side of the web of material at spatially separated positions. This printing step may further comprise rotating the front edge relative to the processing area subsequent to the step of repeatedly printing indicia on the second side of the web of material, but prior to the step of applying adhesive to the first side.

The step of cutting the folded web of material may be performed by die-cutting, perforating, or slitting. Preferably, the cutting step includes cutting a matrix into the folded web of material. In such an embodiment, the method of manufacturing radio frequency devices further include the step of removing the matrix from the folded web of material.

In some embodiments the web of material is transparent. In such embodiments, the method of manufacturing radio frequency devices may further comprise printing indicia on the first side of the web of material at spatially separated positions.

In some embodiments repeatedly applying sets of an antenna and a microchip further comprise applying sets of an antenna and a microchip to the adhesive.

In some embodiments the method of manufacturing radio frequency devices may further includes the step of applying silicone along a length of a portion of the first side, as the web of material is transported over the process area, prior to the step of applying adhesive.

According to a second aspect of the present invention there is provided a method of manufacturing a plurality of individual radio frequency identification (RFID) labels from a web of material having a first side and a second side opposite the first side, and having opposing side edges extending along the web of material and defining a longitudinal dimension and having a front edge transverse to the side edges. This method comprises: (1) transporting the web of material over a process area having a plurality of process stations; (2) applying silicone along a length of a first portion of the first side, as the web of material is transported over the process area; (3) applying adhesive along a length of a second portion of the first side, as the web of material is transported over the process area; (4) repeatedly applying inlays to the adhesive at spatially separated positions, as the web of material is transported over the process area; (5) folding the web of material in the longitudinal dimension to bring the opposing side edges into proximity or contact, thereby layering the sets of an antenna and a microchip between the web of material and holding the sets of an antenna and a microchip in place by the adhesive; and (6) cutting the folded web of material into individual RFID labels.

In some embodiments applying adhesive to the first side of the web of material may further comprise pattern coating the first portion of the web of material with adhesive and flood coating a second portion of the web of material with adhesive. It is preferable to apply the inlays to the first portion of the web of material to which silicone has been applied.

The method of producing RFID labels may further comprise the step of repeatedly printing indicia on the second side of the web of material at spatially separated positions, as the web of material is transported over the process area. In some embodiments this step further comprises rotating the front edge of the web of material relative to the process area, subsequent to the step of repeatedly printing indicia on the second side of the web of material, but prior to the step of applying silicone.

According to a third aspect of the present invention there is provided a method of processing a web of material to manufacture a plurality of individual radio frequency identification (RFID) labels. This method comprises: (1) transporting the web of material over a process area having a plurality of process stations, where the web of material has a first side and a second side; (2) repeatedly printing information on a first side of the web of material at spatially separated positions, as the web of material is transported over the process area; (3) applying silicone on the second side to a portion of a length of the web of material; (4) applying adhesive to a portion of the second side of the web of material; (5) repeatedly applying inlays to the adhesive, as the web of material is transported over the process area; (6) longitudinally folding the second side of the web of material to bring opposing portions of the second side together such that the inlays are layered between the web of material; and (7) cutting the folded web of material into individual RFID labels.

BRIEF DESCRIPTION OF DRAWINGS

Benefits and advantages of the present invention will become apparent to those skilled in the art to which this invention relates from the subsequent description of example embodiments and the appended claims, taken in conjunction with the accompanying drawings, in which:

DETAILED DESCRIPTION

Figure 1A:
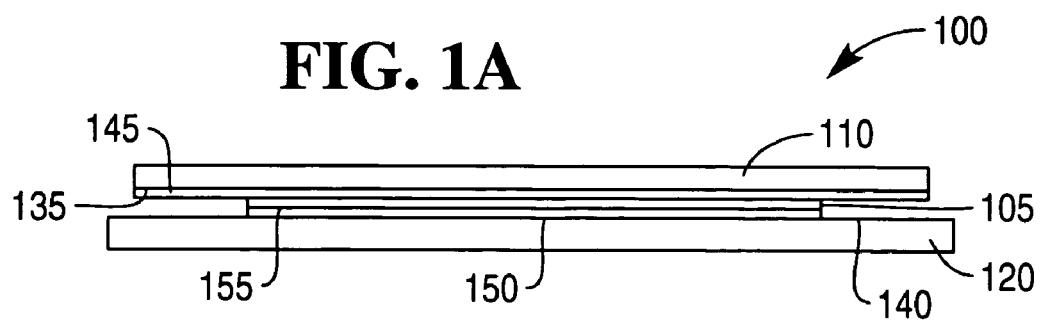
FIGS. 1A, 1B, 1C and 1D are a plan view of a radio frequency device (in the form of an RFID label) in accordance with an embodiment of the present invention.
Figure 1B:
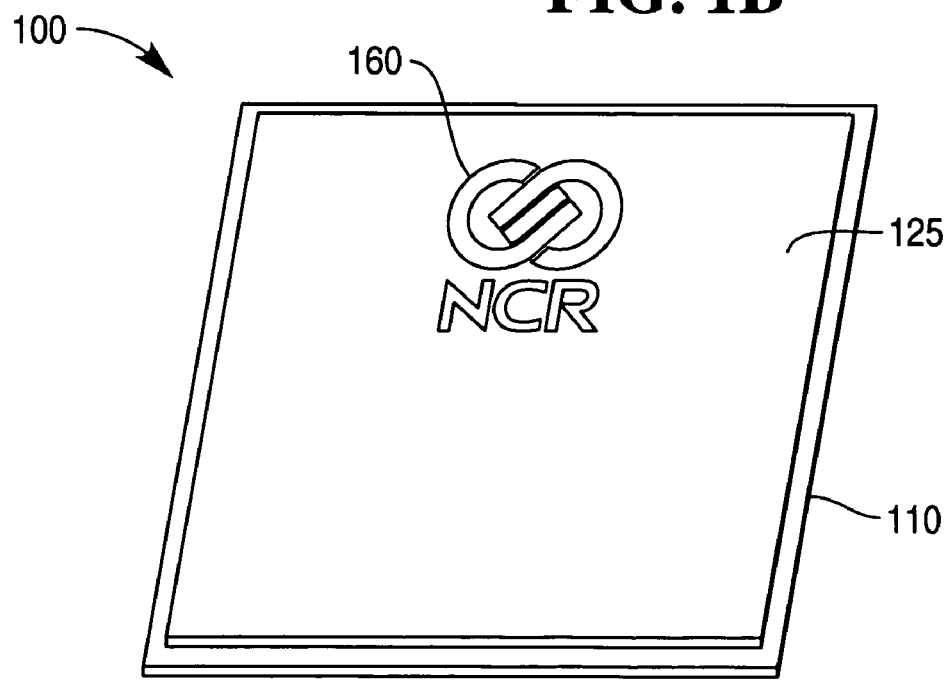
Figure 1C:
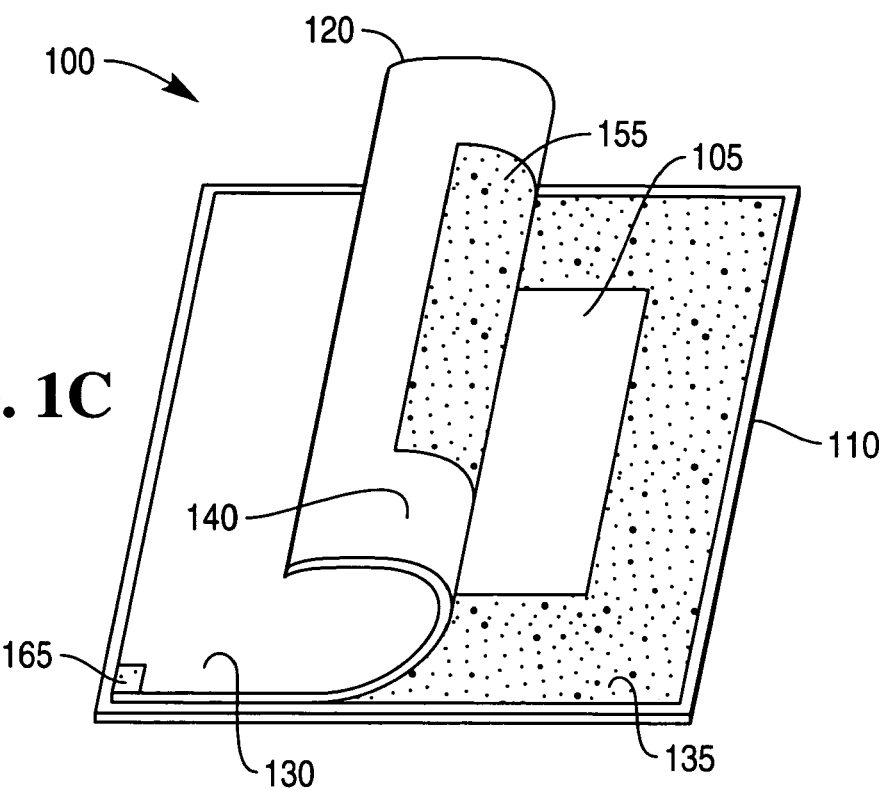

FIGS. 1A through 1C show a radio frequency device 100, in the form of a RFID label according to one embodiment of the present invention.

Figure 1D:
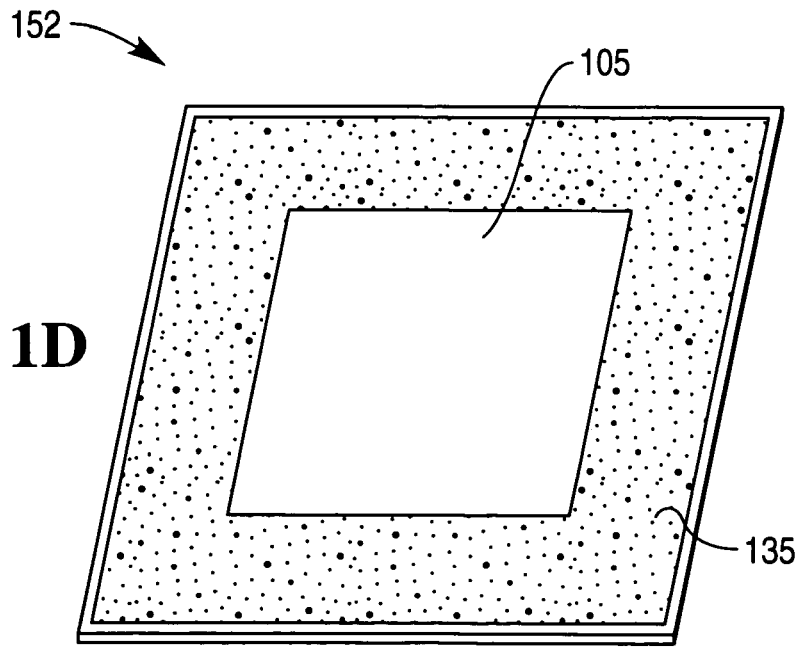

The RFID label 100 includes a RFID inlay 105 positioned between a facestock sheet 110 and a liner sheet 120. The facestock sheet 110 has an outer surface 125 and an inner surface 135; and the liner sheet 120 has an outer surface 130 and an inner surface 140. The inner surface 135 of the face stock sheet 110 is coated with an adhesive layer 145, which strongly adheres the inlay 105 to the facestock sheet 110 to provide a single facestock-inlay unit 152 (illustrated in FIG. 1D). The inner surface 140 of the liner sheet 120 is coated with a silicone release layer 150 to enable easy removal of media adhered thereto, such as the facestock-inlay unit 152. The adhesive layer 145, together with a spot of adhesive 155 (positioned between the inlay 105 and the release layer 150), releasably adhere the facestock-inlay unit 152 to the liner sheet 120, enabling the facestock-inlay unit 152 to be peeled from the coated liner sheet 120. Typically, the adhesives 145 and 155 will be the same type of adhesive, though in some embodiments they may be different.

The RFID label 100 is imprinted with indicia, as desired by the end user of the label. For instance the outer surface 125 of facestock sheet 110 may be imprinted with a corporate logo 160 and the outer surface 130 of the liner sheet may be imprinted with sense marks 165 to facilitate automated orientation or positioning of the label 100.

Figure 2:
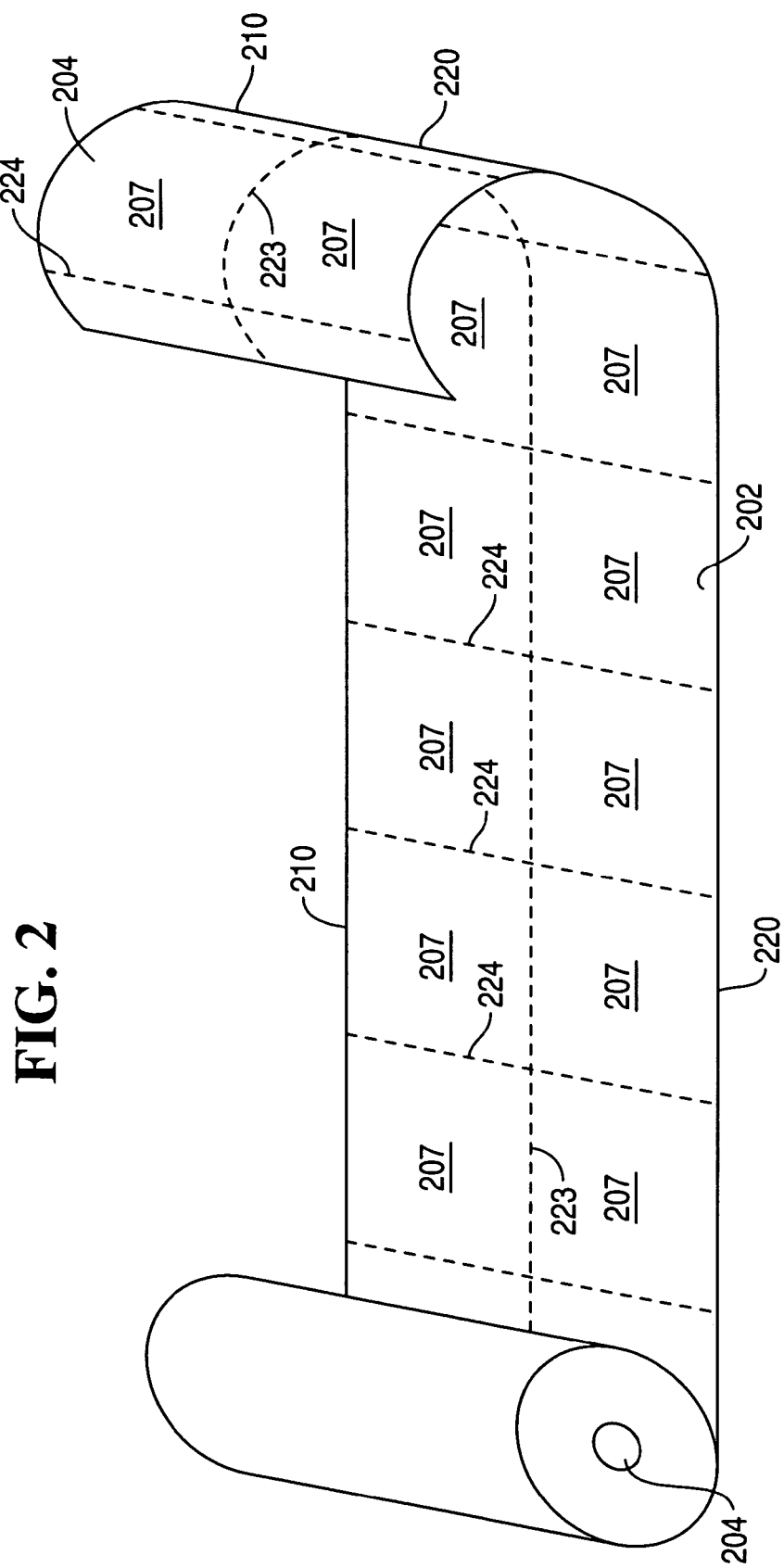
FIG. 2 shows a web of label stock used in the production of the radio frequency device of FIG. 1.

FIG. 2 shows a web 200 of label stock material wound around a spool 204. The web 200 has a mounting surface 202 and a printable surface 204 which opposes the mounting surface 202. The web 200 has two portions: a facestock portion 210, and a liner portion 220, on opposing sides of a longitudinal centerline 223. The web 200 is twice the width of the label 100, with the facestock portion 210 and the liner portion 220 both being the same width as the label 100.

A plurality of label defining lines 224 are provided perpendicular to the longitudinal centerline 223, and equally spaced apart along the web 200. It will be appreciated that the label defining lines 224, in combination with the longitudinal centerline 223, define a plurality of discrete locations 207, i.e. spatially separated positions, on the web. On the facestock portion 210, adjacent label defining lines 224 and the longitudinal centerline 223 define a facestock sheet (corresponding to facestock sheet 110); whereas, on the liner portion 220, adjacent label defining lines 224 and the centerline 223 define a liner sheet (corresponding to liner sheet 120).

The web 200 has a mounting surface 202 that corresponds to the inner surface 135 and 140, of the label 100, and a printable surface 204 that corresponds to the outer surface 125 and 130, of the label 100. Thus, when the web is folded along the centerline, a continuous web of RFID labels 100 is formed, with the label defining lines 224 indicating the edges of each label.

It will be appreciated that the foregoing discussion has delineated various features of the web 200 (such as the longitudinal centerline and the label defining lines) even though there may be no physical markings on the web 200 corresponding to these features.

It will be further appreciated that that by using a single-ply web of uniform construction in the production of RFID labels, as opposed to the typical pre-manufactured two-ply label web stock (as discussed in the background), substantial cost savings may be realized.

Any suitable material may be selected for the web 200, for example a natural material (such as paper) or a synthetic material (such as polyester) may be used. Factors such as the intended use of the resulting label and the cost of material will often dictate, or at least influence, the type of material chosen for the web 200.

Figure 3:
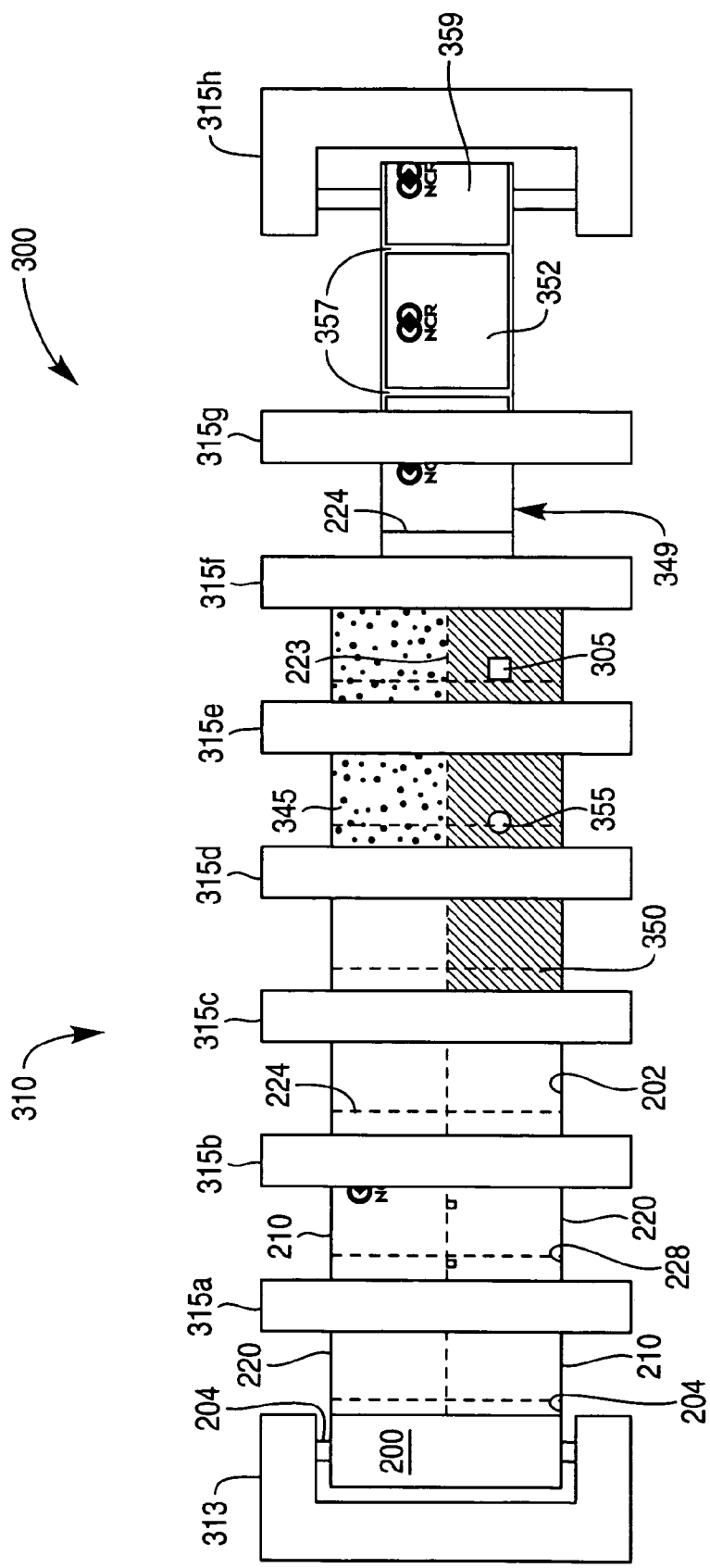
FIG. 3 shows a manufacturing system for transporting the web of FIG. 2 over a process area having a plurality of processing stations.
Figure 4:
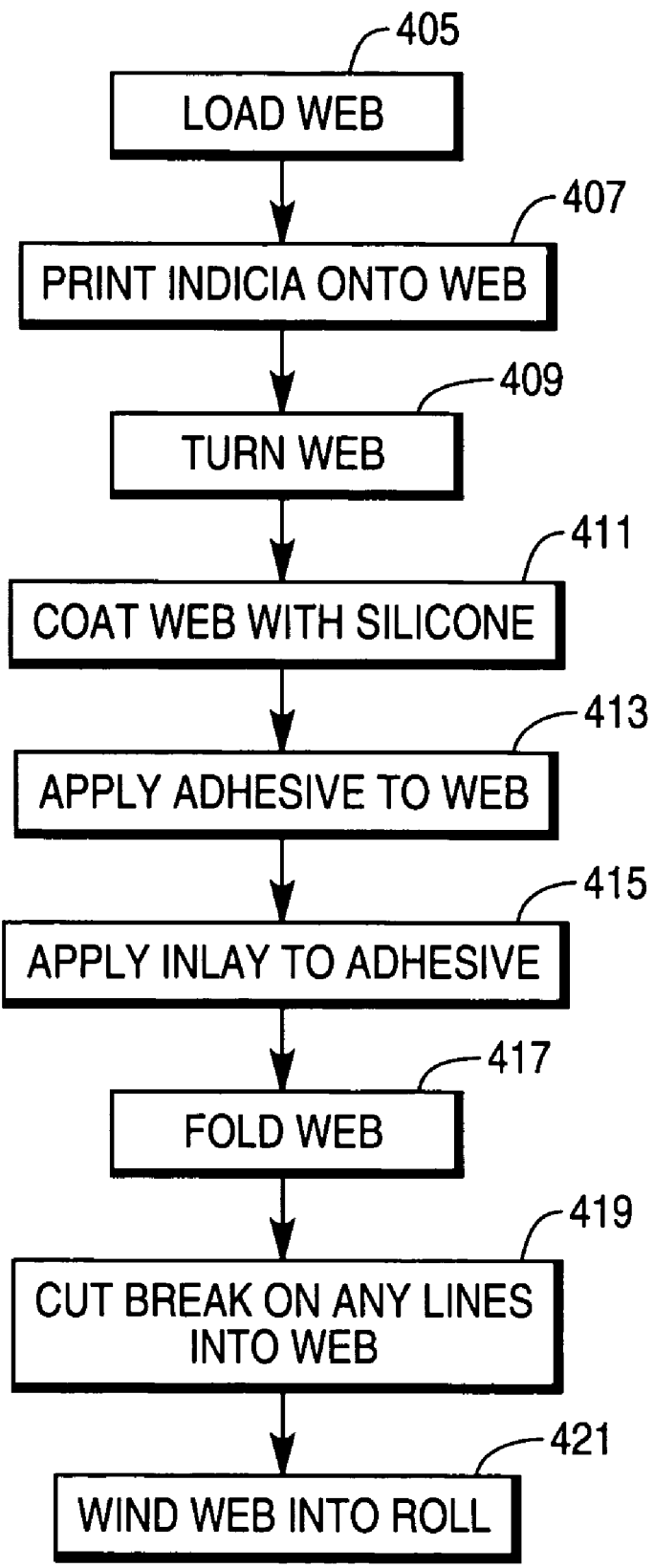
FIG. 4 is a flow chart illustrating a process performed by the manufacturing system of FIG. 3.

Reference is now made to FIG. 3 and FIG. 4. FIG. 3 shows a RFID label manufacturing system 300, which transports the web 200 over a process area (shown generally by arrow 310) having a plurality of process sites, in the form of processing stations 315a-g, each station performing a particular task in the assembly of the RFID label 100. FIG. 4 is a flow chart showing a process 400 which is performed by the RFID label manufacturing system 300.

It will be appreciated that the system 300 produces an RFID label in one continuous process, which includes printing indicia on the web of material 200, applying a silicone release layer on the web of material, applying adhesive on the web of material, inserting an inlay on the web of material, folding the web of material and cutting the folded web of material into individual RFID labels.

Typically, the process 400 begins by loading the web 200 into the manufacturing system 300 at the loading station 313 (step 405). From the loading station 313, the web 200 is drawn from the spool 204 into the processing area 310 with the printable surface 204 facing up and is transported through the printing station 315a. As the web passes through the printing station 315*a* indicia is printed onto the printable surface 204 between adjacent label defining lines 224 (step 407). The indicia includes corporate information (such as a logo) printed on the facestock portion 210 and sense marks printed on the liner portion 220. It will be appreciated that in other embodiments, various other information or nothing may be printed on either portion. The printing station 315*a* can employ any of a variety of printing methods commonly used to print labels, such as, but not limited to, flexography, lithography, gravure printing, and screen printing.

From printing station 315*a* the web 200 advances along the process area 300 to the turning station 315*b*, where the web is turned over (step 409) so that the mounting surface 202 of the web is exposed for processing.

From the turning station 315*b*, the web 200 advances to the silicone coating station 315*c*. As the web passes under the silicone coating station 315*c* the liner portion 220 of the web is coated with a film 350 of silicone (step 411), which corresponds to the silicone release layer 150 of the RFID label 100.

After being coated with silicone, the web 200 advances to the adhesive coating station 315*d*, where adhesive is applied to the web 200 (step 413). The face stock portion 210 receives a flood coating 345 of adhesive, while the siliconized side, i.e. the liner portion 220, receives a pattern coating 355. The pattern coating 355 includes a pattern of adhesive between each set of adjacent label defining lines 224. In some embodiments, both the facestock portion 210 and the liner portion 220 are flood coated, in which case there is no pattern coating.

After the adhesive coating station 315*d*, the web 200 advances along the process area to the inserter station 315*e*, where one RFID inlay 305 is applied to each pattern coating 355 of adhesive (step 415). The inserter station 315*e* may use any suitable technology to apply the inlays, such as a vacuum roll, a card inserter or equivalents thereof. It will be appreciated that in alternative embodiments an inlay 305 may be applied to the facestock portion 210 at each discrete location 207.

The web 200 then advances to the folding station 315*f*, where the liner portion 220 and the facestock portion 210 of the mounting surface 202 are folded together along the longitudinal centerline 223 (step 417), thereby creating a two-ply web 349 of connected RFID labels.

From the folding station 315*f* the web 200 is advanced to the cutting station 315*g*, where a matrix 357 is cut through the facestock portion 210 and then stripped (i.e. removed) from the two-ply web 349 (step 419). The cutting station 315*g* may employ any suitable technique to cut the web, such as die cutting or slitting. It will be appreciated that the matrix 357 comprises the outer periphery of each of the discrete locations 207 on the facestock portion 210. Thus, by cutting and removing the matrix 357, individual label units 352 (which correspond to the facestock-inlay unit 152) are produced at each of the discrete locations 207 and are connected only by the liner portion 220 to which they are adhered.

After the cutting station 315*g*, the web 200 advances to rolling station 315*h* where the web 200 is rolled into a roll 359 of finished RFID labels. These individual label units 352 are fully functioning RFID labels and can be peeled away from the liner portion 220 and applied to articles as desired.

In some embodiments the liner portion may be cut, but not severed, along each of the label defining lines 224 resulting in break-away lines. It will be appreciated that the cutting station 315*g* may employ any suitable technique to cut the break-away lines, such as die cutting, perforating, and slitting. The break-away lines allow individual RFID labels (including the liner) to be easily separated from the web by cutting, snapping, tearing, or otherwise breaking the break-away lines.

It will be appreciated that as the web advances through each of the processing stations 315*a-g*, (1) the web may continually advance (i.e. constantly move) over the processing area 310, as each of the processing stations 315*a-g* performs its particular task; (2) it may advance in increments stopping at each station to be processed; or (3) depending on the task to be performed, it may continually advance through some stations and stop at others. Moreover, it will be appreciated that "transporting" or "advancing" the web may be read to mean continually transporting or incrementally transporting the web.

The text above describes one or more specific embodiments of a broader invention. The invention also is carried out in a variety of alternative embodiments and thus is not limited to those described here. Many other embodiments are also within the scope of the following claims.

For example, in some embodiments an antenna may be applied directly to the facestock portion of the web instead of an inlay. In such an embodiment, the antenna will typically be in the form of conductive ink or conductive adhesive. After the antenna is applied to the web, a microchip is mounted on the web in such a way that it is in electrical communication with the antenna. In some embodiments a strap (or interposer) will be used to connect the chip to the antenna. It will be appreciated that the strap carries the chip and connects to the terminals of the chip. It will further be appreciated that the term chip wherever used may be taken to mean either a chip or a strap carrying a chip.

It will be appreciated that the microchip need not be mounted immediately following the application of the antenna to the web. After the antenna is applied to the web, the web may undergo numerous other processing steps before the microchip is mounted and attached to the antenna. For example, in some embodiments the liner portion and the facestock portion are folded together prior to mounting the antenna. In such embodiments, the web (generally the liner portion of the web) will be provided with a plurality of access holes, one corresponding to each antenna. Once the liner portion and the facestock portion of the web are folded together each access hole provides an opening through which a microchip can be mounted and attached to the corresponding antenna.

For example, the above embodiments are directed to producing two-ply RFID labels, however, the disclosed production method is equally applicable to producing RFID devices with no silicone release layer, such as hang-tags. In such embodiments, the silicone coating station is not required and will not be present.

Moreover, while the process described above shows a single roll of RFID labels being produced from the web 200, the production process disclosed is equally useful in producing multiple rolls of RFID labels from one web. For example, a web with a 4×N array of discrete locations can be used to produce a 2×N array of finished labels. This larger web provides four discrete locations across the width of the web, two of which correspond to the face stock portion and two of which correspond to the liner portion of the web 200. This larger web is processed in a similar way to the web 200, though instead of cutting 1×N matrix, a 2×N matrix is cut into the web of two-ply labels. The web may also be cut longitudinally, thereby rendering the 2×N matrix into to 2 separate finished rolls of RFID labels.

In the embodiments disclosed above, a matrix is cut into the face stock portion of the web to create individual RFID labels, though in other embodiments the same may be accomplished by butt-cutting the face stock portion across each of the label defining lines. In such embodiments break-away lines may be cut in the liner portion of the web to allow individual RFID labels to be easily separated from the web.

In the above embodiments both the web of the initial label stock and the web of finished product are stored in rolls, however, the webs may alternatively be stored in fan fold stacks or in any other convenient arrangement.

In the above embodiments, the web is turned after being printed with desired indicia. In other embodiments, however, the printer is positioned under the web and the web is printed with desired indicia as it passes over the printer or the web is printed on both sides at once. In such embodiments the web may not be turned over, so that a turning station is not present. In other embodiments the web may be pre-printed with indicia prior to entering the process area.

In the above embodiments, indicia, such as corporate logos and sense marks, is printed on the surface of the web which eventually becomes the exterior surfaces of the two-ply RFID label, however, in some embodiments the indicia is printed on the surface of the web which becomes the interior surfaces of the two-ply RFID label. In such embodiments, the web comprises a transparent synthetic material that allows the printed indicia to be seen through the web.

It will be appreciated that the forgoing embodiments have been given by way of example and that many other embodiments are within the scope of the following claims.

The invention claimed is:

1. A method of manufacturing a plurality of individual radio frequency devices from a web of material having a first side and a second side opposite the first side, and having opposing side edges extending along the web of material and defining a longitudinal dimension and having a front edge transverse to the side edges, the method comprising:
   transporting the web of material over a processing area;
   applying adhesive to the first side as the web is transported over the processing area;
   repeatedly applying sets of an antenna and a microchip to the first side of the web of material at spatially separated positions, as the web is transported over the processing area;
   folding the web of material in the longitudinal dimension to bring the opposing side edges into proximity or contact, thereby layering the sets of an antenna and a microchip between the web of material and at least partly holding the sets of an antenna and a microchip in place by the adhesive, as the web is transported over the processing area;
   cutting the folded web of material into individual radio frequency devices, as the web is transported over the processing area;
   printing indicia on the second side of the web of material at spatially separated positions; and
   rotating the front edge relative to the processing area subsequent to the step of repeatedly printing indicia on the second side of the web of material, but prior to the step of applying adhesive to the first side.

* * * * *